(12) United States Patent
Lee et al.

(10) Patent No.: US 12,193,201 B2
(45) Date of Patent: Jan. 7, 2025

(54) MINI-CHANNEL COLD PLATE WITH THREE-DIMENSIONAL ADAPTIVE FLOW-PATH USING BI-METAL FINS

(71) Applicant: Hamilton Sundstrand Corporation, Charlotte, NC (US)

(72) Inventors: Jin Lee, Busan (KR); Yongduk Lee, Vernon, CT (US); Parag M. Kshirsagar, South Windsor, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 215 days.

(21) Appl. No.: 17/847,769

(22) Filed: Jun. 23, 2022

(65) Prior Publication Data

US 2023/0422452 A1     Dec. 28, 2023

(51) Int. Cl.
*H05K 7/20*     (2006.01)

(52) U.S. Cl.
CPC ..... *H05K 7/20927* (2013.01); *H05K 7/20409* (2013.01)

(58) Field of Classification Search
CPC . H01L 23/473; H01L 23/3672; H01L 23/367; H05K 7/20418; H05K 7/20;
(Continued)

(56) References Cited

U.S. PATENT DOCUMENTS

| | | | |
|---|---|---|---|
| 5,887,551 A * | 3/1999 | Ban | F24V 40/00 122/26 |
| 6,016,250 A * | 1/2000 | Hanners | H01L 23/3735 174/16.3 |

(Continued)

FOREIGN PATENT DOCUMENTS

| | | |
|---|---|---|
| DE | 102019125022 A1 | 5/2020 |
| EP | 3032580 A1 | 6/2016 |
| JP | 2013026434 A | 2/2013 |

OTHER PUBLICATIONS

Abstract for DE102019125022 (A1), Published: May 14, 2020, 1 page.

(Continued)

*Primary Examiner* — Adam B Dravininkas
(74) *Attorney, Agent, or Firm* — CANTOR COLBURN LLP

(57) ABSTRACT

The present disclosure provides for cooling systems, assemblies and methods (e.g., for semiconductor devices; for refrigerant cooling; for cryogenic cooling). More particularly, the present disclosure provides for mini-channel cold plate cooling assemblies, systems and methods for semiconductor devices (e.g., wide-bandgap (WBG) power semiconductor devices), with the cooling assemblies, systems and methods utilizing three-dimensional adaptive flow-paths using bi-metal fins. The present disclosure provides for mini-channel cold plate cooling assemblies, systems and methods that may improve cooling performance and/or enable local cooling control. The present disclosure provides for bi-metal strips that operate as both the surface-temperature sensors and actuators without input energy. The bi-metal strips guide the coolant flow to a low-drag channel when the surface temperature is low, and guide the coolant flow to the near-surface channel when the surface temperature is high.

20 Claims, 10 Drawing Sheets

(58) Field of Classification Search
CPC ............. H05K 1/0203; H05K 7/20836; H05K 7/20281; H05K 7/20927; H05K 7/20409
See application file for complete search history.

(56) References Cited

U.S. PATENT DOCUMENTS

| | | | | |
|---|---|---|---|---|
| 6,182,749 | B1* | 2/2001 | Brost | F28D 9/005 |
| | | | | 123/196 AB |
| 6,305,463 | B1* | 10/2001 | Salmonson | G06F 1/20 |
| | | | | 361/698 |
| 6,330,157 | B1* | 12/2001 | Bezama | H01L 23/473 |
| | | | | 361/689 |
| 8,434,692 | B2* | 5/2013 | Scott | F23R 3/06 |
| | | | | 165/96 |
| 10,221,498 | B2 | 3/2019 | Pascall et al. | |
| 2006/0131733 | A1* | 6/2006 | Mongia | H01L 23/473 |
| | | | | 257/E23.098 |
| 2008/0192430 | A1* | 8/2008 | Brandenburg | H01L 23/473 |
| | | | | 165/104.11 |
| 2009/0321044 | A1* | 12/2009 | Hernon | H01L 23/34 |
| | | | | 165/80.2 |
| 2015/0235920 | A1* | 8/2015 | Skinner | H01L 23/467 |
| | | | | 257/713 |
| 2017/0211897 | A1* | 7/2017 | Agee | F28F 3/027 |
| 2018/0355990 | A1* | 12/2018 | Simpson | F28D 9/0062 |
| 2020/0187385 | A1* | 6/2020 | Olesen | H01L 23/473 |
| 2020/0229322 | A1* | 7/2020 | Bostick | H05K 7/20772 |

OTHER PUBLICATIONS

Abstract for JP2013026434 (A), Published: Feb. 4, 2013, 1 page.
European Search Report for Application No. 23180459.2, mailed Nov. 13, 2023, 8 pages.

* cited by examiner

MINI-CHANNEL COLD PLATE WITH THREE-DIMENSIONAL ADAPTIVE FLOW-PATH USING BI-METAL FINS

TECHNICAL FIELD

The present disclosure relates to cooling systems, assemblies and methods and, more particularly, to mini-channel cold plate cooling assemblies, systems and methods for semiconductor devices (e.g., wide-bandgap (WBG) power semiconductor devices), with the cooling assemblies, systems and methods utilizing three-dimensional adaptive flow-paths using bi-metal fins.

BACKGROUND

In general, wide-bandgap (WBG) semiconductor devices, such as gallium nitride (GaN) and silicon carbide (SiC) devices, have attracted interest from aerospace application areas. Some of these SiC/GaN power semiconductor devices can have improved performance than Si power devices from a lower intrinsic carrier concentration, a higher electric breakdown field, a higher thermal conductivity and/or a higher saturated electron drift velocity performance. However, a factor that can affect overall power density is the thermal performance of the system. In general, the better the system is at getting heat out, the more power losses one can typically afford without seeing unreasonable temperature rises. It is noted that an overall goal of the thermal optimization of a package, heatsink and printed circuit board (PCB) can be to reduce the temperature rise in the presence of the power converter losses. As the trends toward miniaturization and cost reduction have progressed, the overall size of the power electronic converter solutions has generally shrunk. This has caused some system-level thermal designs to become increasingly difficult, because smaller WBG sizes typically result in worse thermal performance.

It is noted that the uniform thermal distribution between WBG device arrangements can be significant for a system life cycle and reliability. Current practice provides that some conventional multi-pass cold plates and mini-channel cold plates have caused unbalanced thermal status due to an increased temperature and/or the multi-level topology.

BRIEF DESCRIPTION

The present disclosure provides for cooling systems, assemblies and methods (e.g., for semiconductor devices; for refrigerant cooling; for cryogenic cooling). More particularly, the present disclosure provides for mini-channel cold plate cooling assemblies, systems and methods for semiconductor devices (e.g., wide-bandgap (WBG) power semiconductor devices), with the cooling assemblies, systems and methods utilizing three-dimensional adaptive flow-paths using bi-metal fins.

The present disclosure provides for a cooling assembly including a cold plate top wall attached to a first cold plate side wall and a second cold plate side wall, the first cold plate side wall attached to a cold plate bottom wall and including a coolant inlet, and the second cold plate side wall attached to the cold plate bottom wall and including a coolant outlet; a substrate positioned on the cold plate top wall, the substrate having a plurality of semiconductor devices positioned on the substrate; and a plurality of bi-metal fins extending from the cold plate top wall towards the cold plate bottom wall; wherein heat from a semiconductor device of the plurality of semiconductor devices causes a coolant introduced between the cold plate top wall and the cold plate bottom wall to raise temperature of the coolant, which causes a bi-metal fin positioned proximal to the heated semiconductor device to deform and change a flow path of the coolant from the coolant inlet to the coolant outlet.

In addition to one or more of the features described, or as an alternative to any of the foregoing embodiments, each bi-metal fin of the plurality of bi-metal fins includes a first metal material and a second metal material, the first metal material different than the second metal material.

In addition to one or more of the features described, or as an alternative to any of the foregoing embodiments, the plurality of semiconductor devices comprises wide-bandgap power semiconductor devices.

In addition to one or more of the features described, or as an alternative to any of the foregoing embodiments, the cold plate top wall, the cold plate bottom wall, the first cold plate side wall and the second cold plate side wall are fabricated from aluminum.

In addition to one or more of the features described, or as an alternative to any of the foregoing embodiments, the substrate is a printed circuit board or a ceramic plate.

In addition to one or more of the features described, or as an alternative to any of the foregoing embodiments, further comprising a plurality of wall extensions extending from the cold plate bottom wall towards the cold plate top wall, the plurality of wall extensions defining a plurality of lower channels for the coolant; and wherein each bi-metal fin of the plurality of bi-metal fins is L-shaped or C-shaped and includes a side wall portion and a bottom wall portion, with each bi-metal fin extending from the cold plate top wall to define a plurality of adjustable upper channels for the coolant.

In addition to one or more of the features described, or as an alternative to any of the foregoing embodiments, when the cold plate top wall temperature increases at a specific area of the cold plate top wall via a heated semiconductor device, the bottom wall portion of each respective bi-metal fin proximal to the heated area of the cold plate top wall bends down toward the cold plate bottom wall and increases cross-sectional areas of the respective upper channels, thereby increasing the amount of the coolant through the respective upper channels.

In addition to one or more of the features described, or as an alternative to any of the foregoing embodiments, when the cold plate top wall temperature cools and decreases at a specific area of the cold plate top wall, the bottom wall portion of each respective bi-metal fin proximal to the cooled area of the cold plate top wall bends up toward the cold plate top wall and decreases cross-sectional areas of the respective upper channels, thereby decreasing the amount of the coolant through the respective upper channels.

In addition to one or more of the features described, or as an alternative to any of the foregoing embodiments, when the cold plate top wall is at a neutral temperature of about 20° C., the plurality of bi-metal fins are in a neutral position, and each bottom wall portion of each bi-metal fin is substantially planar or horizontal.

In addition to one or more of the features described, or as an alternative to any of the foregoing embodiments, each bi-metal fin includes a first section of a first metal material, a first section of a second metal material, a second section of the first metal material, and a second section of the second metal material; and the first section of the first metal material is secured to the first section of the second metal material, and the second section of the first metal material is secured to the second section of the second metal material.

In addition to one or more of the features described, or as an alternative to any of the foregoing embodiments, when the cold plate top wall temperature increases at a specific area of the cold plate top wall via a heated semiconductor device, the first section of the first metal material and the first section of the second metal material of each respective bi-metal fin proximal to the heated area of the cold plate top wall are curved, and the second section of the first metal material and the second section of the second metal material of each respective bi-metal fin proximal to the heated area of the cold plate top wall are curved, thereby forming an elongated O-shaped gap in a middle area between the first section of the second metal material and the second section of the second metal material.

In addition to one or more of the features described, or as an alternative to any of the foregoing embodiments, each elongated O-shaped gap increases the amount of the coolant through each elongated O-shaped gap.

In addition to one or more of the features described, or as an alternative to any of the foregoing embodiments, the first metal material comprises aluminum and the second metal material comprises nickel.

In addition to one or more of the features described, or as an alternative to any of the foregoing embodiments, the first metal material comprises aluminum and the second metal material comprises titanium.

The present disclosure provides for a cooling method including providing a cold plate top wall attached to a first cold plate side wall and a second cold plate side wall, the first cold plate side wall attached to a cold plate bottom wall and including a coolant inlet, and the second cold plate side wall attached to the cold plate bottom wall and including a coolant outlet, with a plurality of bi-metal fins extending from the cold plate top wall towards the cold plate bottom wall; positioning a substrate on the cold plate top wall, the substrate having a plurality of semiconductor devices positioned on the substrate; and introducing a coolant between the cold plate top wall and the cold plate bottom wall via the coolant inlet; wherein heat from a semiconductor device of the plurality of semiconductor devices causes the coolant introduced between the cold plate top wall and the cold plate bottom wall to raise temperature of the coolant, which causes a bi-metal fin positioned proximal to the heated semiconductor device to deform and change a flow path of the coolant from the coolant inlet to the coolant outlet.

In addition to one or more of the features described, or as an alternative to any of the foregoing embodiments, further comprising a plurality of wall extensions extending from the cold plate bottom wall towards the cold plate top wall, the plurality of wall extensions defining a plurality of lower channels for the coolant; and wherein each bi-metal fin of the plurality of bi-metal fins is L-shaped or C-shaped and includes a side wall portion and a bottom wall portion, with each bi-metal fin extending from the cold plate top wall to define a plurality of adjustable upper channels for the coolant; and wherein when the cold plate top wall temperature increases at a specific area of the cold plate top wall via a heated semiconductor device, the bottom wall portion of each respective bi-metal fin proximal to the heated area of the cold plate top wall bends down toward the cold plate bottom wall and increases cross-sectional areas of the respective upper channels, thereby increasing the amount of the coolant through the respective upper channels.

In addition to one or more of the features described, or as an alternative to any of the foregoing embodiments, when the cold plate top wall temperature cools and decreases at a specific area of the cold plate top wall, the bottom wall portion of each respective bi-metal fin proximal to the cooled area of the cold plate top wall bends up toward the cold plate top wall and decreases cross-sectional areas of the respective upper channels, thereby decreasing the amount of the coolant through the respective upper channels.

In addition to one or more of the features described, or as an alternative to any of the foregoing embodiments, each bi-metal fin includes a first section of a first metal material, a first section of a second metal material, a second section of the first metal material, and a second section of the second metal material; and the first section of the first metal material is secured to the first section of the second metal material, and the second section of the first metal material is secured to the second section of the second metal material.

In addition to one or more of the features described, or as an alternative to any of the foregoing embodiments, when the cold plate top wall temperature increases at a specific area of the cold plate top wall via a heated semiconductor device, the first section of the first metal material and the first section of the second metal material of each respective bi-metal fin proximal to the heated area of the cold plate top wall are curved, and the second section of the first metal material and the second section of the second metal material of each respective bi-metal fin proximal to the heated area of the cold plate top wall are curved, thereby forming an elongated O-shaped gap in a middle area between the first section of the second metal material and the second section of the second metal material.

In addition to one or more of the features described, or as an alternative to any of the foregoing embodiments, each elongated O-shaped gap increases the amount of the coolant through each elongated O-shaped gap.

The above described and other features are exemplified by the following figures and detailed description.

Any combination or permutation of embodiments is envisioned. Additional features, functions and applications of the disclosed systems, assemblies and methods of the present disclosure will be apparent from the description which follows, particularly when read in conjunction with the appended figures. All references listed in this disclosure are hereby incorporated by reference in their entireties.

BRIEF DESCRIPTION OF THE DRAWINGS

The following figures are example embodiments wherein the like elements are numbered alike.

Features and aspects of embodiments are described below with reference to the accompanying drawings, in which elements are not necessarily depicted to scale.

Figure 1:
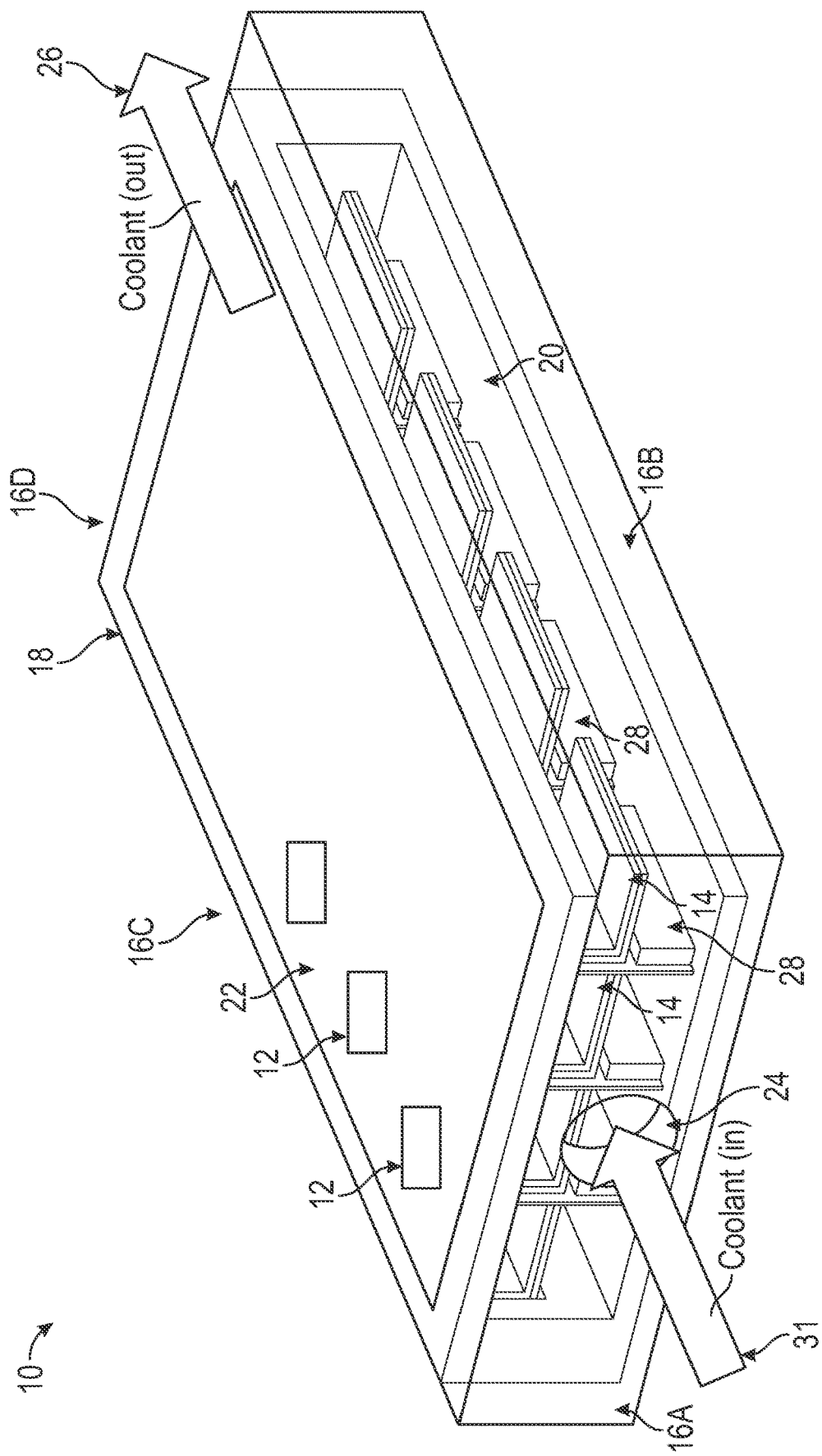
Figure 2:
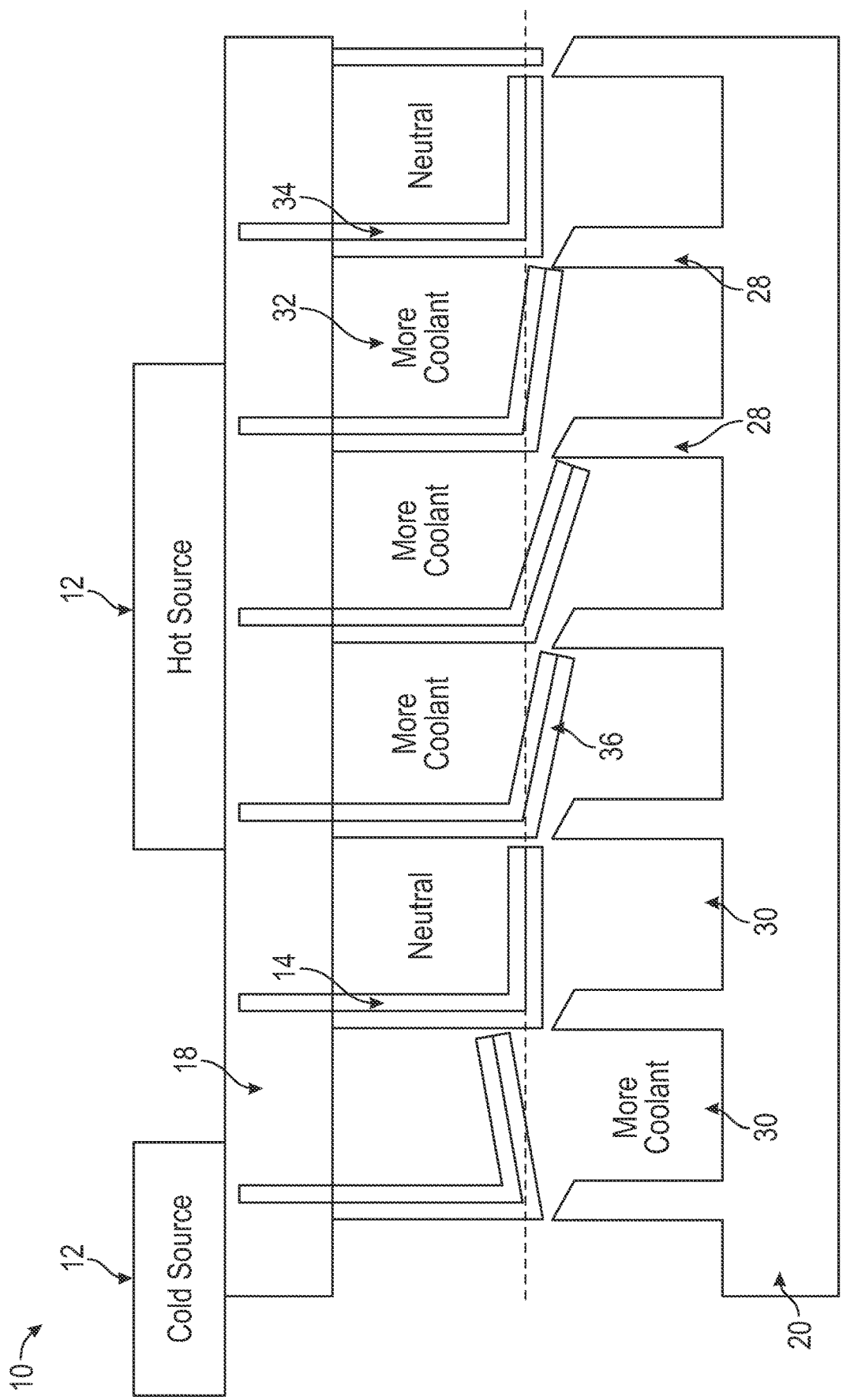
Figure 3:
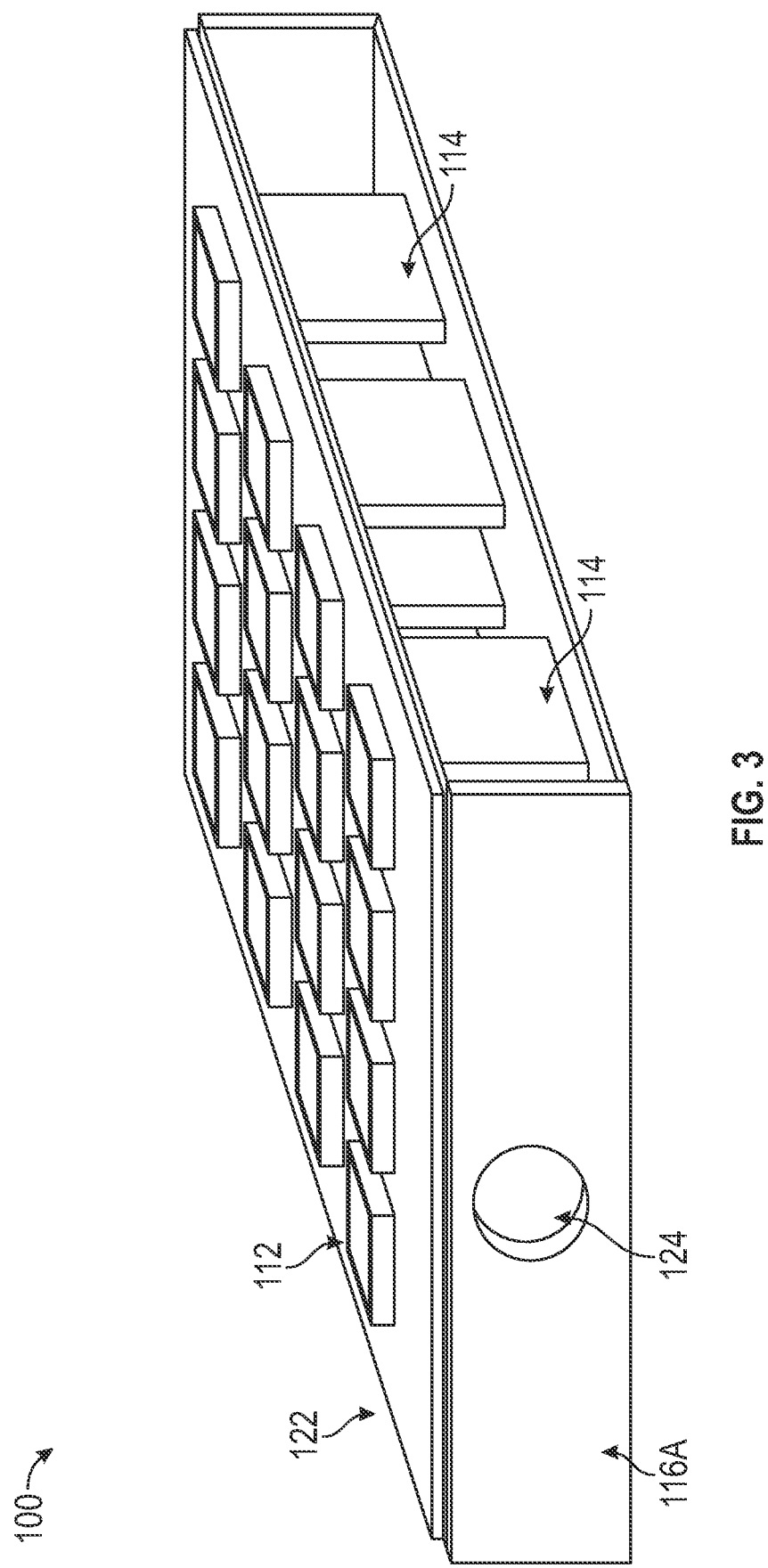
Figure 4:
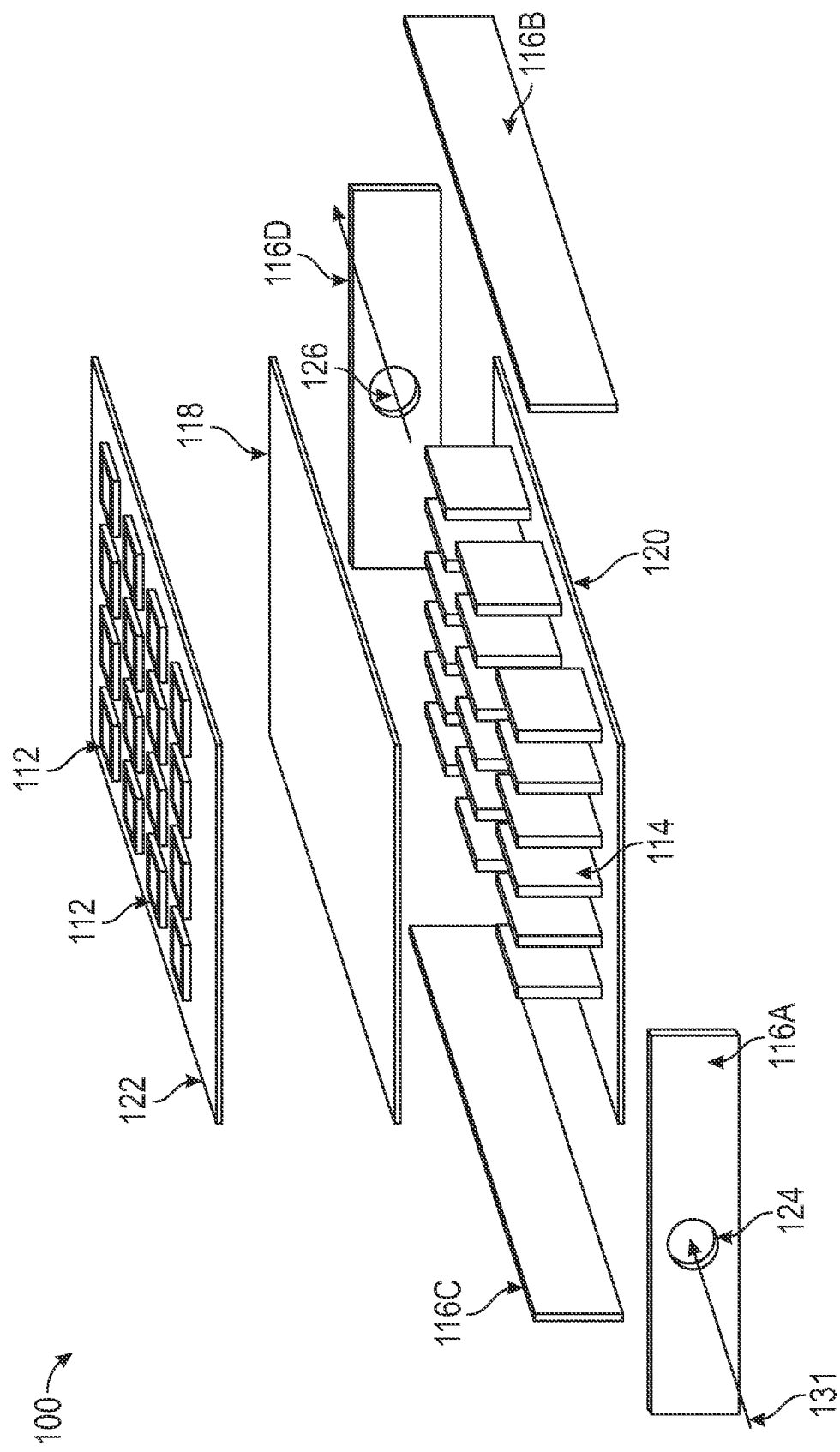
Figure 5:
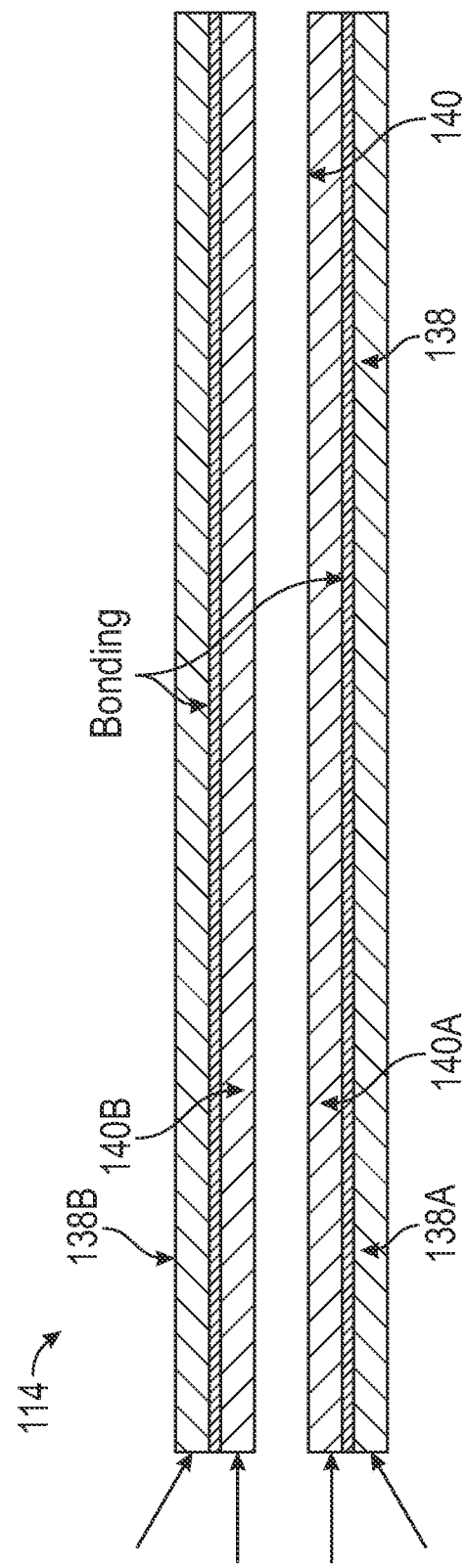
Figure 6:
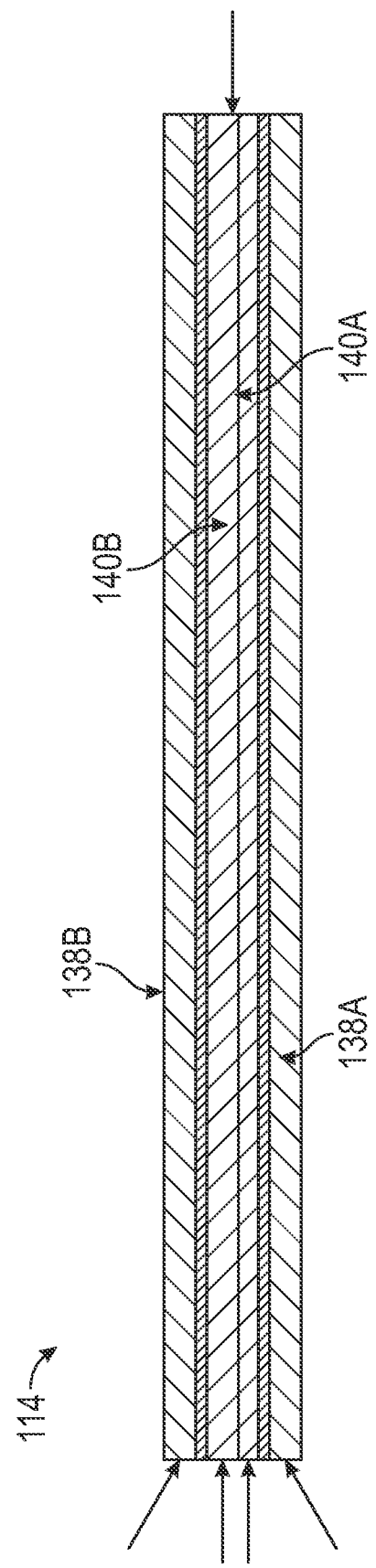
Figure 7:
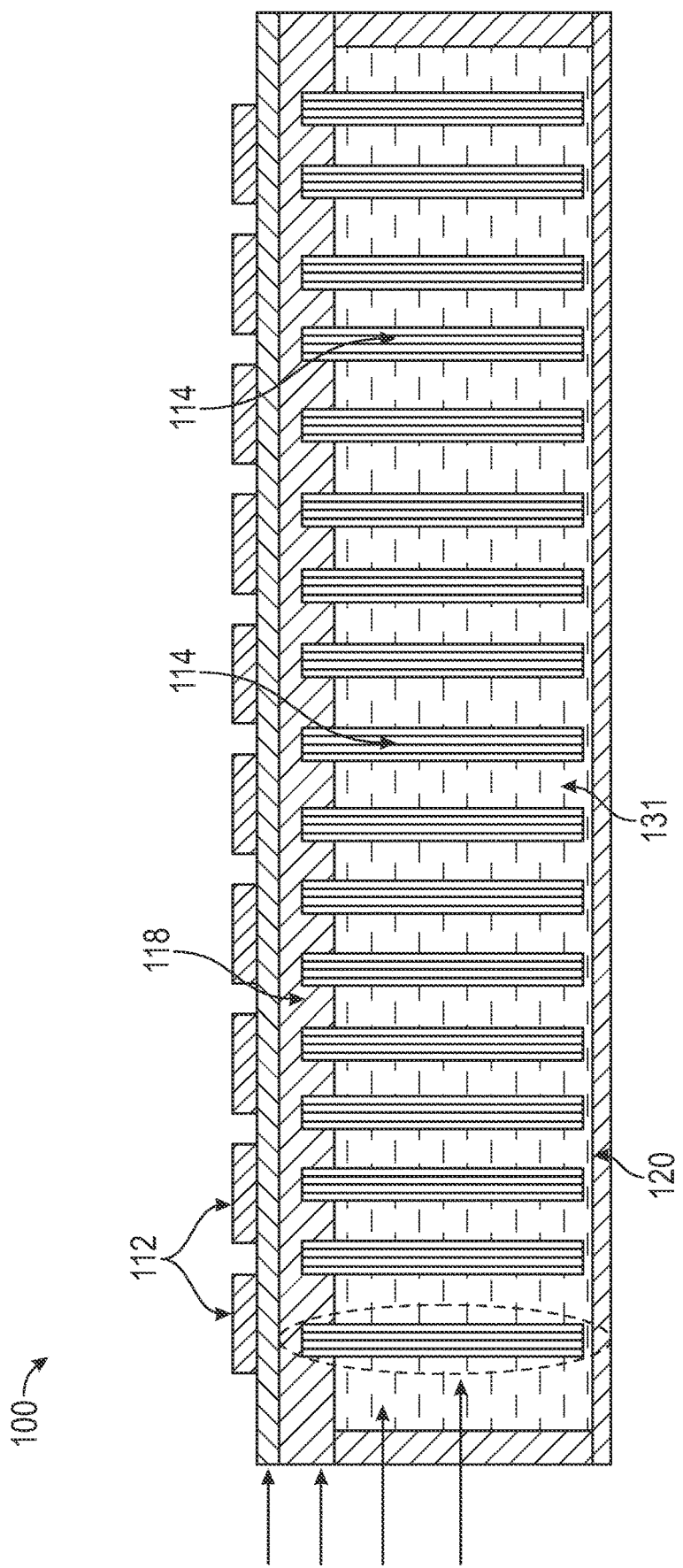
Figure 8:
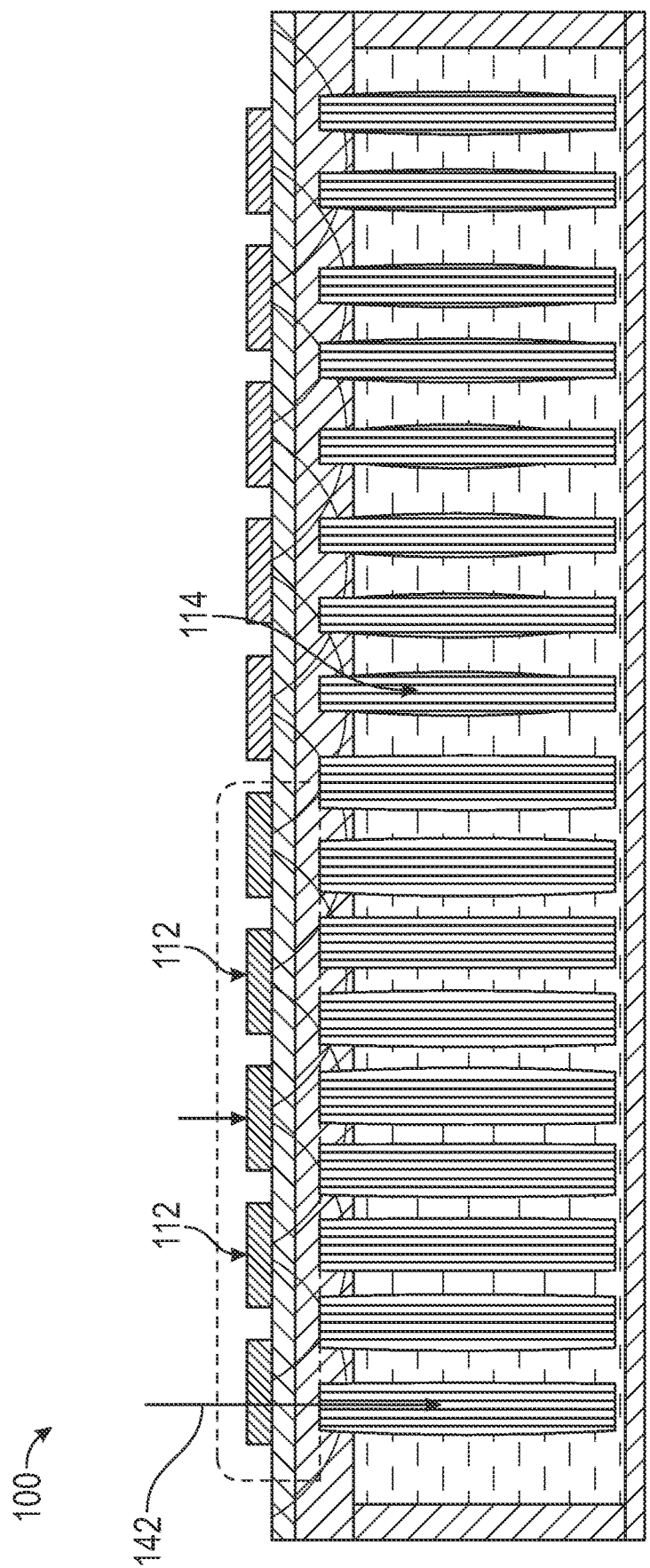
Figure 9:
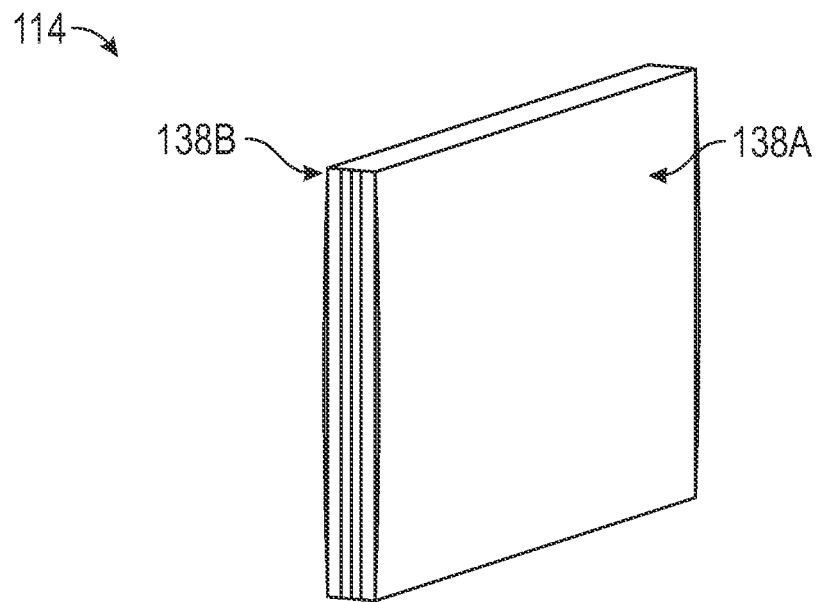
Figure 10:
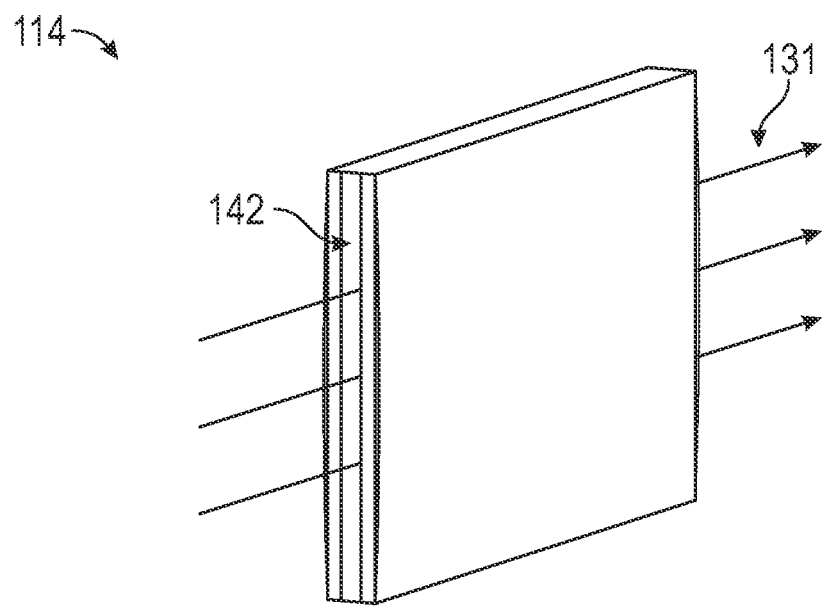
Figure 11:
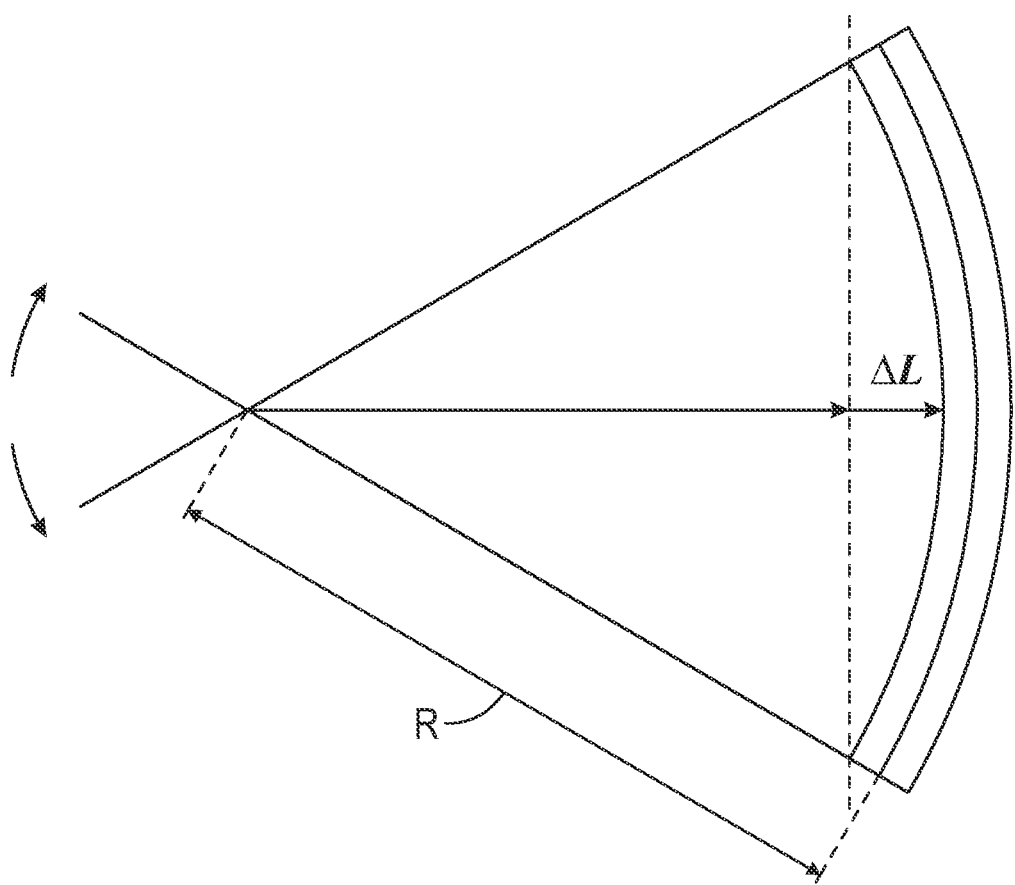
Figure 12:
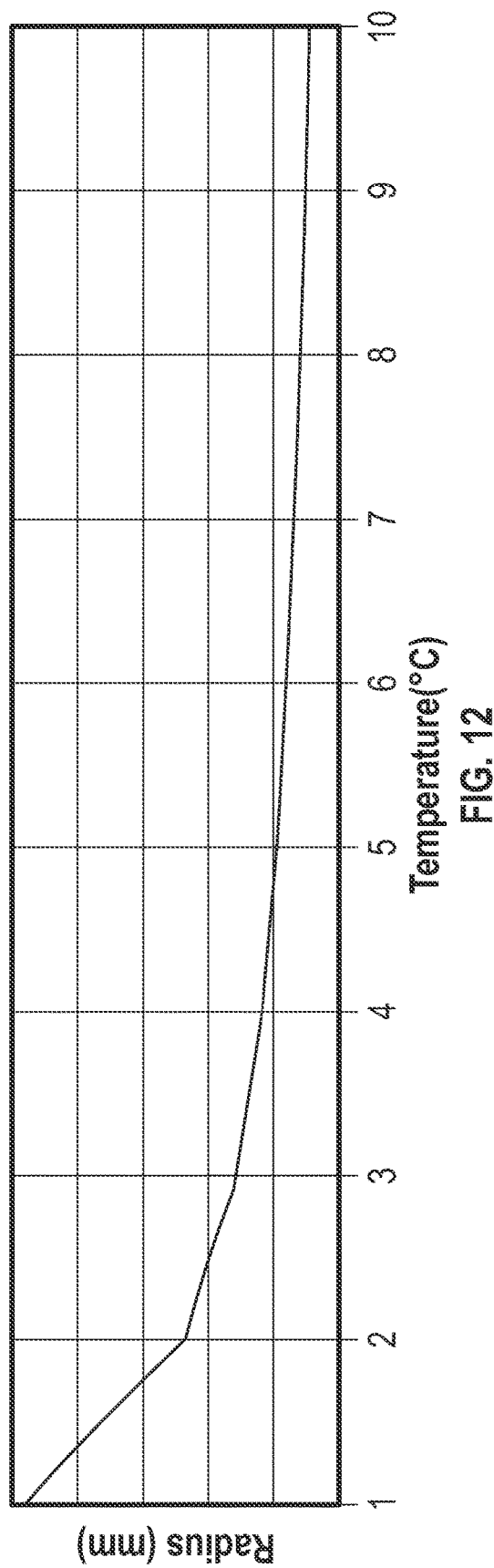
Figure 13:
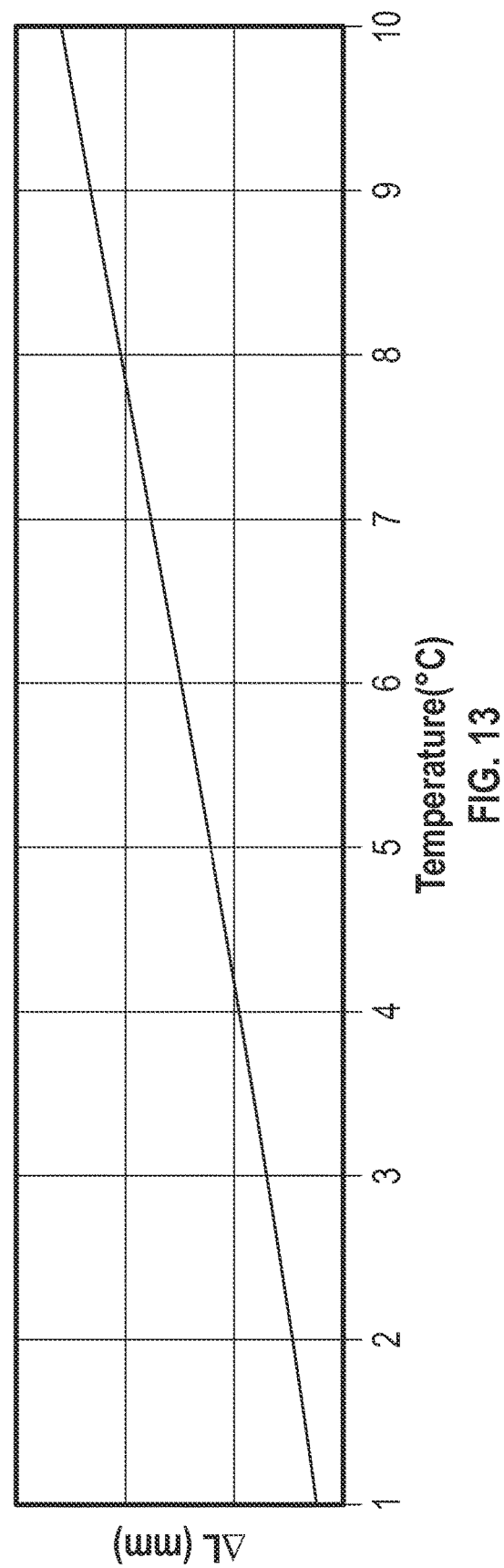

Example embodiments of the present disclosure are further described with reference to the appended figures. It is to be noted that the various features, steps, and combinations of features/steps described below and illustrated in the figures can be arranged and organized differently to result in embodiments which are still within the scope of the present disclosure. To assist those of ordinary skill in the art in making and using the disclosed systems, assemblies and methods, reference is made to the appended figures, wherein:

FIG. 1 is a partial top side perspective view of an example cooling assembly, according to the present disclosure;

FIG. 2 is a cross-sectional side view of the cooling assembly of FIG. 1, according to the present disclosure;

FIG. 3 is a side perspective view of another example cooling assembly, according to the present disclosure;

FIG. 4 is an exploded view of the cooling assembly of FIG. 3, according to the present disclosure;

FIG. 5 is a cross-sectional side view of an example bi-metal fin prior to assembly, according to the present disclosure;

FIG. 6 is a cross-sectional side view of an example bi-metal fin after assembly, according to the present disclosure;

FIGS. 7-8 are cross-sectional side views of an example cooling assembly, according to the present disclosure;

FIGS. 9-10 are side perspective views of an example bi-metal fin, according to the present disclosure;

FIG. 11 is a depiction showing the radius and change in length for an example bi-metal fin during deflection, according to the present disclosure;

FIG. 12 is a graph showing radius of an example bi-metal fin versus temperature difference between the bi-metal fin and coolant, according to the present disclosure; and FIG. 13 is a graph showing change in length of an example bi-metal fin versus temperature difference between the bi-metal fin and coolant, according to the present disclosure.

DETAILED DESCRIPTION

The example embodiments disclosed herein are illustrative of cooling assemblies, and systems of the present disclosure and methods/techniques thereof. It should be understood, however, that the disclosed embodiments are merely examples of the present disclosure, which may be embodied in various forms. Therefore, details disclosed herein with reference to example cooling systems and associated processes/techniques of fabrication/assembly and use are not to be interpreted as limiting, but merely as the basis for teaching one skilled in the art how to make and use the assemblies/systems and/or alternative assemblies/systems of the present disclosure.

The present disclosure provides for cooling systems, assemblies and methods (e.g., for semiconductor devices; for refrigerant cooling; for cryogenic cooling). More particularly, the present disclosure provides for mini-channel cold plate cooling assemblies, systems and methods for semiconductor devices (e.g., wide-bandgap (WBG) power semiconductor devices), with the cooling assemblies, systems and methods utilizing three-dimensional adaptive flow-paths using bi-metal fins.

As noted above, current practice provides that some conventional system-level thermal designs have become increasingly difficult, because smaller wide-bandgap (WBG) semiconductor device sizes typically result in worse thermal performance. As such, power converter designs can be affected by such disadvantages. As noted, the uniform thermal distribution between devices can be important for the system life cycle and reliability. Typically, the multi-level topology can be a good candidate in order to get an improved performance. This topology can have a complicated configuration, as more WBG devices can be required compared to some conventional two-level (2L) systems. In addition, some multi-level topologies can have an unbalanced current/voltage state. This can cause an unbalanced thermal state on the heatsink or coldplate. Thus, an improved WBG device arrangement and cooling path can be a high priority factor for overall performance.

As such, some conventional multi-pass coldplates have caused severe unbalanced thermal status due to an increased temperature. Some conventional mini-channel coldplates have also caused unbalanced thermal status due to the multi-level topology. As noted, a flow control system can be required in accordance with an unbalanced thermal status. In order to get improved performance and a long life cycle, the present disclosure provides for coldplate assemblies based on adaptive flow control systems and methods.

The present disclosure provides for mini-channel cold plate cooling assemblies, systems and methods that may improve cooling performance and/or enable local cooling control. One benefit of the cooling assemblies and systems of the present disclosure can be achieved by adapting the internal coolant flow-path in three-dimensions (3D) according to the surface temperature. The present disclosure provides for bi-metal fins or strips that operate as both the surface-temperature sensors and actuators without input energy. The bi-metal strips guide the coolant flow to a low-drag channel when the surface temperature is low, and guide the coolant flow to the near-surface channel when the surface temperature is high.

FIG. 1 is a partial top side perspective view of a cooling assembly 10, according to certain embodiments of the present disclosure. In example embodiments, cooling assembly 10 takes the form of a mini-channel cold plate cooling assembly 10 for semiconductor devices 12 (see FIG. 3) (e.g., wide-bandgap (WBG) power semiconductor devices 12), with the cooling assembly 10 utilizing three-dimensional adaptive flow-paths using bi-metal fins 14. FIG. 2 is a cross-sectional side view of the cooling assembly 10 of FIG. 1.

As shown in FIG. 1, cooling assembly 10 includes cold plate side walls 16A-16D, a cold plate top wall 18, and a cold plate bottom wall 20. In example embodiments, walls 16A-16D, 18 and 20 are fabricated from aluminum (e.g., aluminum cold plate walls 16A-16D, 18 and 20).

The semiconductor devices 12 of assembly 10 can be positioned on a substrate 22 (e.g., printed circuit board (PCB) 22 or ceramic plate 22). In example embodiments, each semiconductor device 12 is a wide band gap device 12 (e.g., GaN device 12, SiC MOSFET (metal-oxide-semiconductor field-effect transistor) device 12, etc.). The substrate 22 can be positioned on the cold plate top wall 18 of assembly 10.

Side wall 16A can include a coolant inlet 24, and side wall 16D can include a coolant outlet 26.

In example embodiments and as shown in FIG. 2, a plurality of bi-metal fins 14 can extend from the top wall 18, and a plurality of wall extensions 28 can extend from bottom wall 20. In general, each bi-metal fin 14 includes a first metal material 38 and a second metal material 40. The first metal material 38 can be different than the second metal material 40.

The plurality of wall extensions 28 can extend from bottom wall to define a plurality of lower channels 30 for a coolant 31 (e.g., fluid or liquid coolant 31) introduced to inlet 24 of assembly 10.

Each bi-metal fin 14 of the plurality of bi-metal fins 14 can be L-shaped or C-shaped, and can extend from the top wall 18 to define a plurality of adjustable upper channels 32 for coolant 31. In general, the L-shaped or C-shaped bi-metals fins 14 include a side wall portion 34 and a bottom wall portion 36.

The bi-metal fins 14 provide thermal uniformity of assembly 10. More particularly, the bi-metal fins 14 provide for adaptive flow of coolant 31 through assembly 10.

One benefit of cooling assembly 10 can be achieved by adapting the internal coolant 31 flow-path in three-dimensions (3D) according to the surface temperature of top wall 18 (e.g., via heat from devices 12). The bi-metal fins or strips 14 operate as both the surface-temperature sensors and actuators without input energy. The bi-metal fins 14 guide the coolant 31 flow to a respective lower channel 30 (e.g., low-drag lower channel 30) when the surface temperature of top wall 18 is low or decreased, and guide the coolant 31 flow to a respective upper channel 32 when the surface temperature of top wall 18 is high or increased.

The lower channels 30 can operate as bypass channels for coolant 31. In example embodiments, the deformation of the bi-metal fins 14 changes the cross-sectional area of each respective upper and lower channels 30, 32 (e.g., mini-channels 30, 32). Due to such adaptive geometry of each bi-metal fin 14, the coolant 31 flow faces a non-uniform flow blockage through the channels 30, 32 of assembly 10, which forces the coolant 31 flow to make more up and down motions of coolant 31 through assembly 10. Consequently, the internal flow of coolant 31 through assembly 10 becomes three-dimensional through assembly 10. For example, a decreased flow of coolant 31 at an upper channel 32 can remain cold, and increased coolant 31 flow is then able to reach the respective lower channel 30 more easily.

The adjustable internal flow-path of coolant 31 includes two adjustable layers, e.g., the plurality of lower channels 30 and the plurality of upper channels 32. The heat sources of devices 12 can be plated on or with respect to the top wall 18.

The L-shaped or C-shaped bi-metal fins 14 can be mounted on or with respect to the top wall 18 for the local coolant 31 flow control. The cross-sectional area of each respective channel 30, 32 thereby varies due to the deformation of the bi-metal fins 14.

For example and as shown in FIG. 2, when the top wall 18 temperature increases at a specific area of the top wall 18, the bottom wall portion 36 of each respective bi-metal fin 14 proximal to such area bends down and increases the cross-sectional area of such respective upper channel 32, thereby increasing the amount of coolant 31 through such respective upper channel 32.

Moreover and as shown in FIG. 2, when the top wall 18 temperature decreases at a specific area of the top wall 18, the bottom wall portion 36 of each respective bi-metal fin 14 proximal to such area bends up and decreases the cross-sectional area of such respective upper channel 32, thereby decreasing the amount of coolant 31 through such respective upper channel 32.

In example embodiments and as shown in FIG. 2, when the top wall 18 is at a neutral temperature (e.g., room temperature of about 20° C.), the bi-metal fins 14 are in a neutral position, and the bottom wall portion 36 can be substantially planar or horizontal.

It is noted that due to the viscous effect of coolant 31 proximal to wall 18, 20, the flow resistance and flow rate of coolant 31 can be determined by the respective channel 30, 32 cross-sectional area.

The adaptation or adjustment of each channel 30, 32 cross-sectional area allows the coolant 31 flow path to be determined/adjusted (e.g., between a dominant layer of lower channel 30 flows and a dominant layer of upper channel 32 flows.

It is noted that specific metals for the bi-metal fins 14 can be selected according to the coolant 31 and/or top wall 18 temperatures.

In example embodiments, the width of each flow channel 30, 32 can be smaller than the size of the respective heat source from devices 12 (e.g., GaN and/or SiC devices 12).

There are many benefits of the assemblies 10 and associated systems/methods, including, without limitation: increased coolant flow can be concentrated to a locally hot area, which can effectively cool the specific area; assembly 10 can prevent over-cooling by partially blocking the upper channels 32 when the surface of wall 18 is too cold; and/or due to the benefit of the bi-metal fins 14, no power input is needed for temperature sensing and flow actuating of assembly 10.

FIG. 3 is a side perspective view of another example cooling assembly 100, according to the present disclosure. Similar to the assembly 10 of FIG. 1, example cooling assembly 100 can take the form of a mini-channel cold plate cooling assembly 100 for semiconductor devices 12 (e.g., wide-bandgap (WBG) power semiconductor devices 12), with the cooling assembly 100 utilizing three-dimensional adaptive flow-paths using bi-metal fins 114.

FIG. 4 is an exploded view of the cooling assembly 100 of FIG. 3.

Similar to assembly 10, the example cooling assembly 100 includes cold plate side walls 116A-116D, a cold plate top wall 118, and a cold plate bottom wall 120 (e.g., aluminum cold plate walls 116A-116D, 118 and 120).

The semiconductor devices 112 of assembly 100 can be positioned on a substrate 122 (e.g., printed circuit board (PCB) 122 or ceramic plate 122). In example embodiments, each semiconductor device 112 is a wide band gap device 12 (e.g., GaN device 112, SiC MOSFET device 112, etc.). The substrate 122 can be positioned on the cold plate top wall 118. Side wall 116A can include a coolant inlet 124 for coolant 131, and side wall 116D can include a coolant outlet 126 for coolant 131.

In example embodiments and as shown in FIG. 3, a plurality of bi-metal fins 114 can extend from the top wall 118.

In certain embodiments, each bi-metal fin 114 includes a first section 138A of first metal material 138, a first section 140A of second metal material 140, a second section 138B of first metal material 138, and a second section 140B of second metal material 140.

The first section 138A can be secured to first section 140A (e.g., via adhesive or bonding material or the like), and the second section 138B can be secured to second section 140B (e.g., via adhesive or bonding material or the like).

Each bi-metal fin 114 can be secured or mounted with respect to the top wall 118, with each fin 114 extending from the wall 118. In some embodiments, it is noted that fins 114 may not be secured to bottom wall 120.

After securing fins 114 to wall 118, the first and second sections 140A, 140B of second metal material 140 are positioned proximal to one another.

FIG. 7 is a cross-sectional side view of cooling assembly 100 where each bi-metal fin 114 is in the neutral position. In some embodiments, each bi-metal fin 114 is substantially flat in the neutral position (e.g., the coolant 131 temperature equals the room temperature of assembly 100). In other embodiments, it is noted that each bi-metal fin 114 has a very small elongated O-shaped gap in the middle area between first and second sections 140A, 140B in the neutral position, as discussed below. It is noted that the temperature of the flat formation of bi-metal fins 114 can be determined by the coolant 131 temperature.

For example, when the coolant 131 temperature is the same as the room temperature of assembly 100, the metal material first sections 138A, 140A are the same length (e.g., length from wall 118 towards wall 120), and second sections 138B, 140B are the same length. However, when there is colder or hotter coolant 131 relative to room temperature of assembly 100, one of the metal materials 138, 140 should be shorter than other metal material. This means that the bi-metal fin 114 can be flat when the coolant 131 temperature is the same as the room temperature of assembly 100. However, it is noted that for considering an effective flow and pressure control of assembly 100, the initial formation of fins 114 (e.g., when the coolant 131 temperature is the same as the room temperature) can be very slightly elongated O-shaped in the middle area between first and second sections 140A, 140B.

As shown in FIGS. 8 and 10, when the temperature of the coolant 131 surrounding a bi-metal fin 114 is increased (e.g., via device 112 relative to wall 118), sections 138A, 138B, 140A, 140B of both metal materials 138, 140 of fin 144 are curved, thereby forming elongated O-shaped gap 142 in the middle area between first and second sections 140A, 140B of fin 114. This gap 142 allows more coolant 131 to flow through this hot area of assembly 100. Thus, the cooling performance of assembly 100 can be improved by flowing more coolant through gaps 142 of fins 114 proximal to hot areas of assembly 100, to cool such hot areas. When the coolant 131 returns close or to room temperature of assembly, the fins 114 return to the neutral position as discussed above.

The material selection for fins 114 can be as follows. For deformation of fins 114, the change in length can be determined by the bi-metal thickness of the fins 114, the thermal expansion coefficient of the materials 138, 140, and the temperature difference between the bi-metal fin 114 and the coolant 131. It is noted that sections 138A and 140A are securely bonded to one another, and sections 138B and 140B are securely bonded to one another. It is also noted that the thermal expansion coefficient of the materials 138, 140 can be a design factor for developing the elongated O-shaped gap 142 of fins 114.

After analysis of the thermal expansion coefficients of the materials 138, 140, it is noted that Al is a good candidate for thermal expansion, and Ti or Ni is less thermally expansive than Al. Thus, Al and Ni, or Al and Ti are good combinations for materials 138, 140 to form the elongated O-shaped gap 142 of fins 114, as discussed above.

There are many benefits of the assemblies 100 and associated systems/methods, including, without limitation: increased coolant flow can be concentrated to a locally hot area, which can effectively cool the specific area; assembly 100 can prevent over-cooling by partially blocking areas when the surface of wall 118 is too cold; and/or due to the benefit of the bi-metal fins 114, no power input is needed for temperature sensing and flow actuating of assembly 100.

It is noted that at least a portion of the example assemblies 10, 100 and/or the bi-metal fins 14, 114 can be utilized for refrigerant cooling (e.g., temperatures of 3 to 5° C. (37 to 41° F.) and/or for cryogenic cooling (e.g., cryogenic temperatures below 120 K (−153° C.)).

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The ranges disclosed herein are inclusive of the endpoints, and the endpoints are independently combinable with each other (e.g., ranges of "up to 25 wt. %, or, more specifically, 5 wt. % to 20 wt. %", is inclusive of the endpoints and all intermediate values of the ranges of "5 wt. % to 25 wt. %," etc.). "Combinations" is inclusive of blends, mixtures, alloys, reaction products, and the like. The terms "first," "second," and the like, do not denote any order, quantity, or importance, but rather are used to distinguish one element from another. The terms "a" and "an" and "the" do not denote a limitation of quantity and are to be construed to cover both the singular and the plural, unless otherwise indicated herein or clearly contradicted by context. "Or" means "and/or" unless clearly stated otherwise. Reference throughout the specification to "some embodiments", "an embodiment", and so forth, means that a particular element described in connection with the embodiment is included in at least one embodiment described herein, and may or may not be present in other embodiments. In addition, it is to be understood that the described elements may be combined in any suitable manner in the various embodiments. A "combination thereof" is open and includes any combination comprising at least one of the listed components or properties optionally together with a like or equivalent component or property not listed.

Unless defined otherwise, technical and scientific terms used herein have the same meaning as is commonly understood by one of skill in the art to which this application belongs. All cited patents, patent applications, and other references are incorporated herein by reference in their entirety. However, if a term in the present application contradicts or conflicts with a term in the incorporated reference, the term from the present application takes precedence over the conflicting term from the incorporated reference.

Although the systems and methods of the present disclosure have been described with reference to example embodiments thereof, the present disclosure is not limited to such example embodiments and/or implementations. Rather, the systems and methods of the present disclosure are susceptible to many implementations and applications, as will be readily apparent to persons skilled in the art from the disclosure hereof. The present disclosure expressly encompasses such modifications, enhancements and/or variations of the disclosed embodiments. Since many changes could be made in the above construction and many widely different embodiments of this disclosure could be made without departing from the scope thereof, it is intended that all matter contained in the drawings and specification shall be interpreted as illustrative and not in a limiting sense. Additional modifications, changes, and substitutions are intended in the foregoing disclosure. Accordingly, it is appropriate that the appended claims be construed broadly and in a manner consistent with the scope of the disclosure.

What is claimed is:

1. A cooling assembly comprising:
a cold plate top wall attached to a first cold plate side wall and a second cold plate side wall, the first cold plate side wall attached to a cold plate bottom wall and including a coolant inlet, and the second cold plate side wall attached to the cold plate bottom wall and including a coolant outlet;
a substrate positioned on the cold plate top wall, the substrate having a plurality of semiconductor devices positioned on the substrate;
a plurality of bi-metal fins extending from the cold plate top wall towards the cold plate bottom wall;
wherein heat from a semiconductor device of the plurality of semiconductor devices causes a coolant introduced between the cold plate top wall and the cold plate bottom wall to raise temperature of the coolant, which causes a bi-metal fin positioned proximal to the heated semiconductor device to deform and change a flow path of the coolant from the coolant inlet to the coolant outlet; and a plurality of wall extensions extending from the cold plate bottom wall towards the cold plate top wall, the plurality of wall extensions defining a plurality of lower channels for the coolant; and wherein each bi-metal fin of the plurality of bi-metal fins includes a side wall portion and a bottom wall portion, with each bi-metal fin extending from the cold plate top wall to define a plurality of adjustable upper channels for the coolant.

2. The assembly of claim 1, wherein each bi-metal fin of the plurality of bi-metal fins includes a first metal material and a second metal material, the first metal material different than the second metal material.

3. The assembly of claim 1, wherein the plurality of semiconductor devices comprises wide-bandgap power semiconductor devices.

4. The assembly of claim 1, wherein the cold plate top wall, the cold plate bottom wall, the first cold plate side wall and the second cold plate side wall are fabricated from aluminum.

5. The assembly of claim 1, wherein the substrate is a printed circuit board or a ceramic plate.

6. The assembly of claim 1, wherein when the cold plate top wall temperature increases at a specific area of the cold plate top wall via a heated semiconductor device, the bottom wall portion of each respective bi-metal fin proximal to the heated area of the cold plate top wall bends down toward the cold plate bottom wall and increases cross-sectional areas of the respective upper channels, thereby increasing the amount of the coolant through the respective upper channels.

7. The assembly of claim 1, wherein when the cold plate top wall temperature cools and decreases at a specific area of the cold plate top wall, the bottom wall portion of each respective bi-metal fin proximal to the cooled area of the cold plate top wall bends up toward the cold plate top wall and decreases cross-sectional areas of the respective upper channels, thereby decreasing the amount of the coolant through the respective upper channels.

8. The assembly of claim 1, wherein when the cold plate top wall is at a neutral temperature of about 20° C., the plurality of bi-metal fins are in a neutral position, and each bottom wall portion of each bi-metal fin is substantially planar or horizontal.

9. The assembly of claim 1, wherein each bi-metal fin includes a first section of a first metal material, a first section of a second metal material, a second section of the first metal material, and a second section of the second metal material; and wherein the first section of the first metal material is secured to the first section of the second metal material, and the second section of the first metal material is secured to the second section of the second metal material.

10. The assembly of claim 9, wherein when the cold plate top wall temperature increases at a specific area of the cold plate top wall via a heated semiconductor device, the first section of the first metal material and the first section of the second metal material of each respective bi-metal fin proximal to the heated area of the cold plate top wall are curved, and the second section of the first metal material and the second section of the second metal material of each respective bi-metal fin proximal to the heated area of the cold plate top wall are curved, thereby forming an elongated O-shaped gap in a middle area between the first section of the second metal material and the second section of the second metal material.

11. The assembly of claim 10, wherein each elongated O-shaped gap increases the amount of the coolant through each elongated O-shaped gap.

12. The assembly of claim 9, wherein the first metal material comprises aluminum and the second metal material comprises nickel.

13. The assembly of claim 9, wherein the first metal material comprises aluminum and the second metal material comprises titanium.

14. A cooling method comprising:

providing a cold plate assembly comprising: a cold plate top wall attached to a first cold plate side wall and a second cold plate side wall, the first cold plate side wall attached to a cold plate bottom wall and including a coolant inlet, and the second cold plate side wall attached to the cold plate bottom wall and including a coolant outlet, with a plurality of bi-metal fins extending from the cold plate top wall towards the cold plate bottom wall, wherein the assembly further includes: a plurality of wall extensions extending from the cold plate bottom wall towards the cold plate top wall, the plurality of wall extensions defining a plurality of lower channels for the coolant, wherein each bi-metal fin of the plurality of bi-metal fins includes a side wall portion and a bottom wall portion, with each bi-metal fin extending from the cold plate top wall to define a plurality of adjustable upper channels for the coolant;

positioning a substrate on the cold plate top wall, the substrate having a plurality of semiconductor devices positioned on the substrate; and introducing a coolant between the cold plate top wall and the cold plate bottom wall via the coolant inlet;

wherein heat from a semiconductor device of the plurality of semiconductor devices causes the coolant introduced between the cold plate top wall and the cold plate bottom wall to raise temperature of the coolant, which causes a bi-metal fin positioned proximal to the heated semiconductor device to deform and change a flow path of the coolant from the coolant inlet to the coolant outlet.

15. The method of claim 14, wherein when the cold plate top wall temperature increases at a specific area of the cold plate top wall via a heated semiconductor device, the bottom wall portion of each respective bi-metal fin proximal to the heated area of the cold plate top wall bends down toward the cold plate bottom wall and increases cross-sectional areas of the respective upper channels, thereby increasing the amount of the coolant through the respective upper channels.

16. The method of claim 15, wherein when the cold plate top wall temperature cools and decreases at a specific area of the cold plate top wall, the bottom wall portion of each respective bi-metal fin proximal to the cooled area of the cold plate top wall bends up toward the cold plate top wall and decreases cross-sectional areas of the respective upper channels, thereby decreasing the amount of the coolant through the respective upper channels.

17. The method of claim 14, wherein each bi-metal fin includes a first section of a first metal material, a first section of a second metal material, a second section of the first metal material, and a second section of the second metal material; and wherein the first section of the first metal material is secured to the first section of the second metal material, and the second section of the first metal material is secured to the second section of the second metal material.

18. The method of claim 17, wherein when the cold plate top wall temperature increases at a specific area of the cold plate top wall via a heated semiconductor device, the first section of the first metal material and the first section of the second metal material of each respective bi-metal fin proximal to the heated area of the cold plate top wall are curved, and the second section of the first metal material and the second section of the second metal material of each respective bi-metal fin proximal to the heated area of the cold plate top wall are curved, thereby forming an elongated O-shaped gap in a middle area between the first section of the second metal material and the second section of the second metal material.

19. The method of claim 18, wherein each elongated O-shaped gap increases the amount of the coolant through each elongated O-shaped gap.

20. A cooling assembly comprising:
a cold plate top wall attached to a first cold plate side wall and a second cold plate side wall, the first cold plate side wall attached to a cold plate bottom wall and including a coolant inlet, and the second cold plate side wall attached to the cold plate bottom wall and including a coolant outlet;
a substrate positioned on the cold plate top wall, the substrate having a plurality of semiconductor devices positioned on the substrate;
a plurality of bi-metal fins extending from the cold plate top wall towards the cold plate bottom wall;
wherein heat from a semiconductor device of the plurality of semiconductor devices causes a coolant introduced between the cold plate top wall and the cold plate bottom wall to raise temperature of the coolant, which causes a bi-metal fin positioned proximal to the heated semiconductor device to deform and change a flow path of the coolant from the coolant inlet to the coolant outlet; and
a plurality of wall extensions extending from the cold plate bottom wall towards the cold plate top wall, the plurality of wall extensions defining a plurality of lower channels for the coolant.

* * * * *